(12) United States Patent
Umeyama et al.

(10) Patent No.: US 7,784,908 B2
(45) Date of Patent: Aug. 31, 2010

(54) FLEXIBLE FILM WIRING BOARD AND LIQUID DISCHARGE HEAD

(75) Inventors: Mikiya Umeyama, Tokyo (JP); Yutaka Koizumi, Yokohama (JP); Yukuo Yamaguchi, Tokyo (JP); Akira Goto, Yokohama (JP); Masaru Iketani, Atsugi (JP); Yuichiro Akama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 527 days.

(21) Appl. No.: 11/248,695

(22) Filed: Oct. 12, 2005

(65) Prior Publication Data

US 2006/0076158 A1    Apr. 13, 2006

(30) Foreign Application Priority Data

Oct. 13, 2004    (JP) .............................. 2004-299213

(51) Int. Cl.
*B41J 2/14* (2006.01)
*B41J 2/16* (2006.01)

(52) U.S. Cl. .......................................... 347/50; 347/58
(58) Field of Classification Search ................... 347/50, 347/56–59
See application file for complete search history.

(56) References Cited

U.S. PATENT DOCUMENTS 6,802,595 B2 * 10/2004 Mizutani ...................... 347/50

2003/0043236 A1 * 3/2003 Mizutani ...................... 347/58

FOREIGN PATENT DOCUMENTS

| JP | 10-076647 A | | 3/1998 |
|---|---|---|---|
| JP | 2002-026471 | * | 1/2002 |
| JP | 2002-026471 A | | 1/2002 |
| JP | 2003-072042 A | | 3/2003 |
| JP | 2004-235321 A | | 8/2004 |

\* cited by examiner

*Primary Examiner*—Juanita D Stephens
(74) *Attorney, Agent, or Firm*—Canon U.S.A., Inc. I.P. Division

(57) ABSTRACT

In a flexible wiring board for use in, for example, a liquid discharge head, wires disposed on a substrate in parallel are covered with a film material. The flexible wiring board is bendable towards one of a front surface side and a back surface side of the substrate and includes a bending line. The bending line is formed by bending the flexible wiring board along a bending direction crossing a longitudinal direction of the wires. The bending line contains the wires. Both ends of the flexible wiring board in the bending direction are located on the bending line. A distance between one of the wires located closest to one end of the flexible wiring board and the one end is larger on the bending line than in another part of the flexible wiring board. Accordingly, even if the flexible wiring board is bent at a small bend radius, peeling does not easily occur between a base film and a cover film.

4 Claims, 7 Drawing Sheets

FLEXIBLE FILM WIRING BOARD AND LIQUID DISCHARGE HEAD

BACKGROUND OF THE INVENTION

1. Field of the Invention

The present invention relates to a flexible wiring board, and to a liquid discharge recording head unit using the flexible wiring board as a unit for transmitting an electrical signal to a recording element substrate.

2. Description of the Related Art

In a typical flexible wiring board, a copper wire is patterned on a substrate (generally, referred to as "base film") having flexibility, and the patterned copper wire is covered with a film material (generally, referred to as the "cover film"). That is, the flexible wiring board has a sandwich structure in which the copper wire is sandwiched and protected by the base film and the cover film. Therefore, there may also be a case where the base film and the cover film are grouped together and referred to as a protective film.

The flexible wiring board with such a structure has an advantage of being capable of enhancing the degree of freedom of a layout of installation of electronic components and substrates, and has been in widespread use for various kinds of small to large electronic instruments or the like. For instance, Japanese Patent Application Laid-Open No. 2003-72042 (corresponding to U.S. Pat. No. 6,802,595) discusses a flexible wiring board used for an ink jet recording head. In this flexible wiring board, a width thereof increases between two bending parts, and correspondingly to this increase, a pitch of a plurality of wires provided on the bending parts also increases. Further, in accordance with an increase in width of the flexible wiring board, the width of each wire itself becomes wider in the vicinity of the bending parts.

However, when the flexible wiring board is flexed and used in such a state, there may be a case where a bending stress in a flexing part causes the failure of an electrically connecting section between the flexible wiring board and another member. To solve this problem, Japanese Patent Application Laid-Open No. 10-76647 discloses a flexible wiring board in which the width of a bending part of the flexible wiring board is made to be 40% to 70% of that of the area of a substrate on which electrodes are disposed.

Further, to solve a similar problem, Japanese Patent Application Laid-Open No. 2004-235321 discloses a flexible wiring board in which a notch part is formed at the end in a bending position. This configuration reduces a resilient stress against bending (a force acting to return a flexible member to original after bending), thereby allowing the bending to be easily performed in a correct position. Further, as shown in FIG. 8, Japanese Patent Application Laid-Open No. 2004-235321 discloses a configuration in which a pitch t2 of a wiring pattern 302 in a predetermined bending position 301 is made narrower as compared with a pitch t1 in a position other than the predetermined bending position 301. However, this configuration is employed for the purpose of securing an area for forming a notch part 303 at the end of the flexible wiring board corresponding to the predetermined bending position 301. Also, similarly, as shown in FIG. 8, Japanese Patent Application Laid-Open No. 2004-235321 discloses a configuration in which a distance s2 between the end of the flexible wiring board 300 and the edge of the closest wiring pattern 302 in the predetermined bending position 301 is made longer as compared with a distance s1 between them in a position other than the predetermined bending position 301. However, this configuration is also employed for the purpose of increasing an area of the end portion of the flexible wiring board 300 in the predetermined bending position 301 and easily forming the notch part 303. For this reason, the size of the distance s1 is similar to that of a distance s3 in the notch part 303 even on a predetermined bending line 304 at which the largest bending stress acts on the flexible wiring board 300. The predetermined bending line means a line supposed to be formed on the flexible wiring board 300 when the flexible wiring board 300 is bent in the predetermined bending position 301.

As described above, in the flexible wiring board having a feature allowing the flexible wiring board to be relatively freely flexed, there has also been recognition of a problem caused by the flexible wiring board returning to an original shape after bending.

Another problem which may arise by bending a flexing part at a right angle or at a small bend radius close to a right angle is that there is a possibility that a large difference of stress occurs between the compression side and the extension side of a base film and a cover film. As a result, the base film and the cover film may be locally peeled off. Then, a problem may arise in that, if the base film and the cover film are peeled off, lifting between the films occurs in a peeled area or in the vicinity thereof, and a space is generated between the wire and the film, thus decreasing the function of protecting the wire. Further, if the above-described space spreads to the end portion of the flexible wiring board, a liquid containing an electrolyte may enter the space between the protective films from the outside thereof, thus causing various problems such as a short circuit, a current leakage, corrosion of the wire or the like.

SUMMARY OF THE INVENTION

An aspect of the present invention is to overcome the above-described drawbacks.

Another aspect of present invention is directed to a flexible wiring board in which a protective film is not easily peeled off even if the flexible wiring board is bent at a right angle or at a small bend radius close to a right angle, or in which, in case of occurrence of the peeling, the peeled area does not easily spread. Furthermore, another aspect of the present invention is also directed to a liquid discharge head using the flexible wiring board.

In one aspect of the present invention, there is provided a flexible wiring board in which wires disposed on a substrate in parallel are covered with a film material and which is bendable towards one of a front surface side and a back surface side of the substrate. The flexible wiring board includes a bending line. The bending line is formed by bending the flexible wiring board along a bending direction crossing a longitudinal direction of the wires. The bending line contains the wires. Both ends of the flexible wiring board in the bending direction are located on the bending line. A distance between one of the wires located closest to one end of the flexible wiring board and the one end is larger on the bending line than in another part of the flexible wiring board. In another aspect of the present invention, there is provided a liquid discharge head using the flexible wiring board.

Further features of the present invention will become apparent from the following detailed description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE EMBODIMENTS

Embodiments of the invention will be described in detail below with reference to the drawings.

First Exemplary Embodiment

Figure 1:
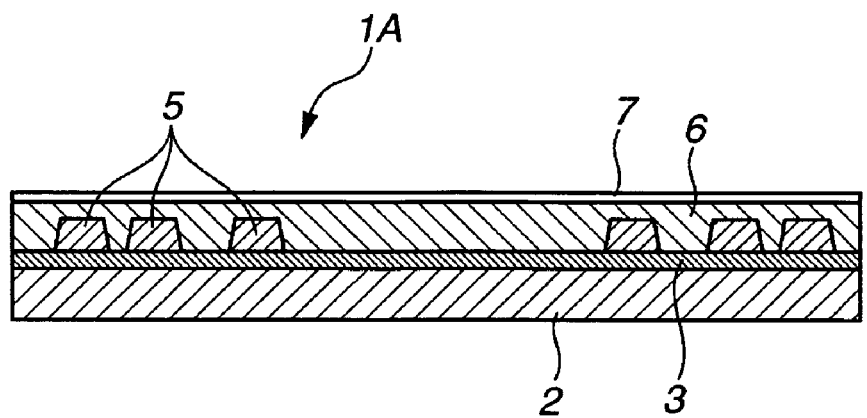
FIG. 1 is a transverse cross sectional view showing a flexible wiring board according to an embodiment of the present invention.
Figure 2:
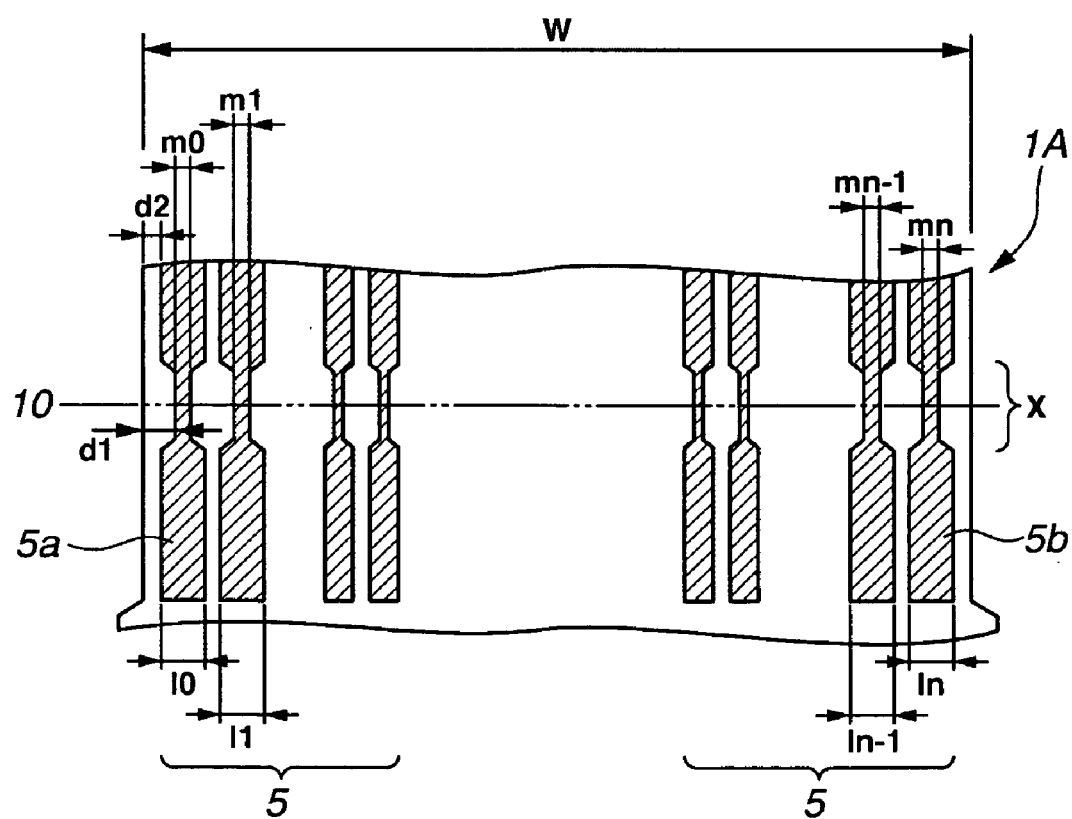
FIG. 2 is a partial plan view of the flexible wiring board shown in FIG. 1.

A flexible wiring board according to a first embodiment of the present invention will now be described with reference to FIGS. 1 and 2. FIG. 1 is a cross sectional view taken along a width direction of a flexible wiring board 1A according to the present embodiment, and FIG. 2 is a partial plan view thereof.

In the flexible wiring board 1A according to the present embodiment, a base film adhesive 3 in a thickness of about 5 μm to 20 μm is coated on the entire surface of a substrate (base film 2) of 30 μm to 100 μm in thickness, and copper wires 5 of 10 μm to 50 μm in thickness are bonded by the base film adhesive 3. The copper wires 5 (such traces/and or leads) are patterned into a desired layout by using a technique such as etching or the like. More specifically, a number of slender copper wires 5 extending in a longitudinal direction of the base film 2 are arranged along a width direction of the base film 2. On the periphery of the copper wires 5, a cover film adhesive 6 is coated. Through the cover film adhesive 6, a film material (cover film 7) of 1 μm to 30 μm in thickness is coated on the copper wires 5.

As apparent from FIG. 1, the cover film adhesive 6 is coated not only on the upper surface (a surface facing the cover film 7) of the copper wires 5 but also on the periphery of the copper wires 5 in such a fashion as to fill in a gap between adjacent copper wires 5. Incidentally, the base film adhesive 3 and the cover film adhesive 6 are similar in quality.

In the configuration which will be described below, a position where the flexible wiring board 1A is bent along a direction crossing a longitudinal direction of the copper wires 5 provided on the flexible wiring board 1A is referred to as a bending line or a bending part. Especially, the bending line means a line that is formed on the flexible wiring board 1A when the flexible wiring board 1A is bent and that is located in a position at which the strongest bending stress acts on the flexible wiring board 1A.

It is helpful to formularize the relationship between the adhesive strengths between the copper wire 5 and the cover film 7, and the adhesive strengths between the base film 2 and the cover film 7. In particular, the adhesive strength between the copper wire 5 made of a metal material and the cover film 7 made of a resin material through the cover film adhesive 6 may be represented as F1. Also, the adhesive strength between the base film 2 and the cover film 7, both of which are made of a resin material, through the base film adhesive 3 and the cover film adhesive 6 may be represented as F2. Then, it can be deduced that the relation expressed by F1<F2 exists. Accordingly, if a bending stress is added to the flexible wiring board 1A, there is a tendency to easily cause the failure of bonding between the copper wire 5 and the cover film 7. More specifically, the interface between the upper face of the copper wire 5 and the cover film adhesive 6 tends to be easily peeled off.

Hence, according to an aspect of the present embodiment, the width of the copper wire 5 in a fixed area X in the same direction including a predetermined area (the bending part 10) where the flexible wiring board 1A is bent at the time of use thereof is made narrower as compared with the width of the copper wire 5 in another area where the width of the flexible wiring board 1A is the same as in the fixed area X. At least on the bending line of the bending part 10, the width of the copper wire 5 (if there are a plurality of copper wires, the width of at least one copper wire) may be made narrower than the width of the copper wire 5 in another area where the width of the flexible wiring board 1A is the same. The fixed area X is a portion in a longitudinal direction of the flexible wiring board 1A, is an area traversing the flexible wiring board 1A in a direction crossing the longitudinal direction thereof, and includes the bending line. As a result of this feature, adhesive strength in the bending part 10 and the vicinity thereof can be enhanced, and particularly, the peeling of the interface between the upper face of the copper wire 5 and the cover film adhesive 6 can be greatly inhibited.

Some of the advantageous aspects of the present embodiment, may be more specifically expressed, in formulaic terms. For instance, the width of each copper wire 5 in the area X including the bending part 10 may be represented by m0 to mn, and a sum total of m0 to mn be quantified as Wm (not shown in FIG. 2). Further, the width of each copper wire 5 in the other area where the width of the flexible wiring board 1A is the same as in the area X (at least the bending part 10) may be represented by l0 to ln, and a sum total of l0 to ln may be represented by Wl. Then, the following relations are obtained:

$$Wm = \sum_{0}^{n} mn \qquad (1)$$

$$Wl = \sum_{0}^{n} ln \qquad (2)$$

$$Wm < Wl \qquad (3)$$

This implies that the total width obtained by totaling the widths of the copper wires 5 in the area X is smaller than the total width obtained by totaling the widths of the copper wires 5 in the other area. In a case where the width of the flexible wiring board 1A is within a fixed range, the above relationship can be regarded as follows. For example, if the width of the flexible wiring board 1A is fixed, the ratio (Wm/W) of the total width (Wm) of the copper wires 5 in the area X to the width (W) of the base film 2 is smaller than the ratio (Wl/W) of the total width (Wl) of the copper wires 5 in an area other than the area X to the width (W) of the base film 2. At least on the bending line of the bending part 10, the ratio (Wm/W) of the total width (Wm) of the copper wires 5 to the width (W) of the base film 2 is smaller than the ratio (Wl/W) of the total width (Wl) of the copper wires 5 in an area other than the bending line to the width (W) of the base film 2. Here, in each case, the width of the base film 2 is the same width W.

Accordingly, a bonded area between the base film 2 and the cover film 7 in the area X becomes larger as compared with that in the other area, so that adhesive strength in the area X can be relatively enhanced. As a result of this, even if the bending part 10 is bent at a right angle or at a small bend radius close to a right angle, peeling does not easily occur between the base film 2 and the cover film 7. In particular, as shown in FIG. 2, if the width of copper wires 5a and 5b near to both ends in a width direction of the flexible wiring board 1A is made narrower, the distance d1 between the copper wire 5a or 5b and the end portion in a width direction of the base film 2 and the cover film 7 becomes maximum in the area X. Further, a space between the adjacent copper wires 5 in the area X is made wider than the width of the copper wire 5, so that adhesive strength between the base film 2 and the cover film 7 in the area X can be enhanced. Therefore, the peeling between the copper wire 5 and the cover film 7 does not easily occur, and even if the peeling occurs between any copper wire 5 and the cover film 7, there is a very small possibility that the peeling spreads to the end portion in the width direction of the base film 2 and the cover film 7.

In the flexible wiring board 1A shown in FIG. 2, the width of all copper wires 5 is narrower in the area X than the width of the copper wires 5 in an area other than the area X. However, in the flexible wiring board 1A according to the present embodiment, it is sufficient if the relation given by the above-described mathematical expressions (1) to (3) is satisfied. Thus, it is not essential that the width of all copper wires 5 is made narrower. Hence, in an alternative embodiment, it is only required to narrow the width of one copper wire. In addition, it is not necessary that the width of each copper wire 5 including the width in the area x be uniform. Further, the area X satisfying the above-described mathematical expressions (1) to (3) can be provided at two or more places along a longitudinal direction of the flexible wiring board 1A.

Here, in the bending part 10, even if the peeling between the base film 2 and the cover film 7 occurs at the area in which the copper wires 5 are arranged, it is sufficient that the peeling does not occur at the end side from the copper wire 5a located closest to the end. In this case, it is possible to prevent the entry of ink or the like from the outside. Hence, in the present embodiment, in the area where the width of the flexible wiring board is the same, the distance between the end and the copper wire located closest to the end may be made larger on the bending line in the bending part 10. In other words, the above-described distance in the area X including the bending part 10 is made larger than that in an area adjacent to the area X. In the present embodiment, the width of the copper wire 5a is made narrower in the bending part 10, so that the distance d1 between the copper wire 5a and the end of the flexible wiring board 1A is made larger than the distance d2 in the area adjacent to the bending part 10.

Second Exemplary Embodiment

A flexible wiring board according to a second embodiment of the present invention will now be described with reference to FIG. 3.

Figure 3:
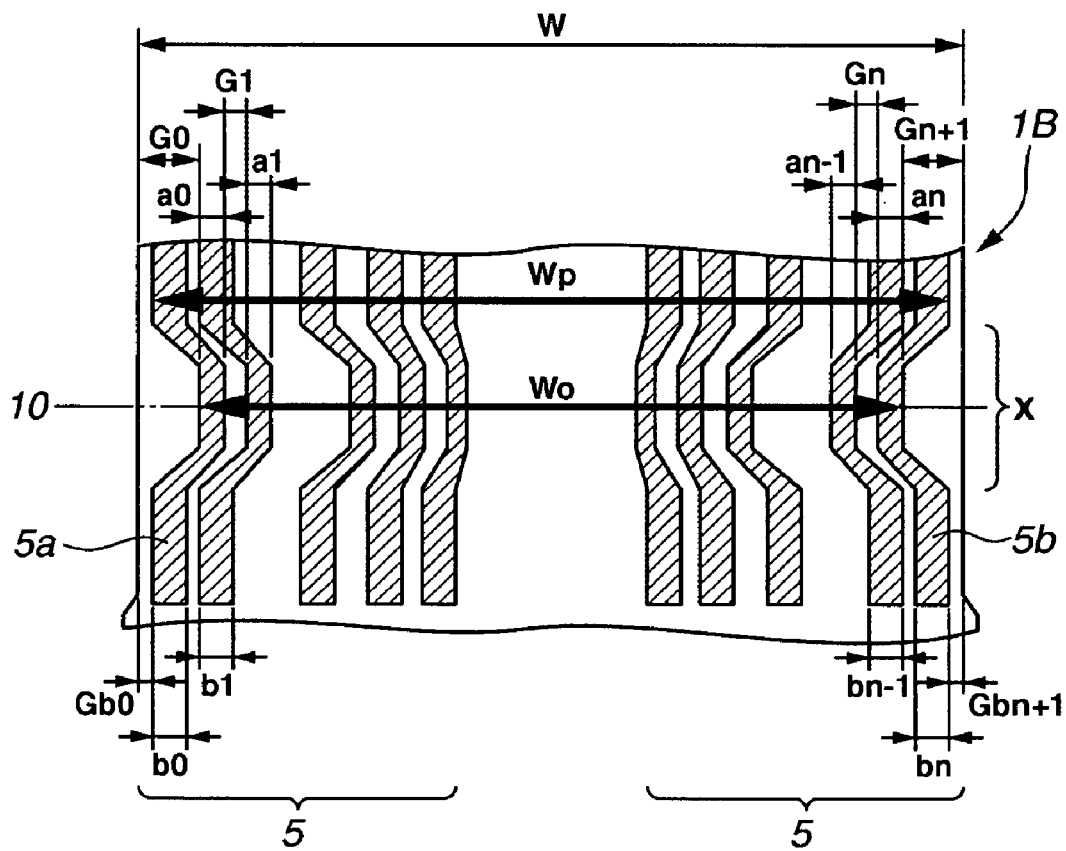
FIG. 3 is a partial plan view showing a flexible wiring board according to another embodiment of the present invention.

FIG. 3 is a partial plan view showing a flexible wiring board 1B according to the present embodiment. The basic structure of the flexible wiring board 1B is similar to that of the flexible wiring board 1A shown in FIG. 1. Also, the width of each copper wire 5 in the area X including the bending part 10 may be respectively represented by a0 to an in turn, and a sum total of a0 to an be represented by Wa (not shown in FIG. 3). Further, the width of the copper wire 5 in the other area where the width of the flexible wiring board 1B is the same as the width in the area X (at least the bending part 10) may be respectively represented by b0 to bn in turn, and a sum total of b0 to bn be represented by Wb (not shown in FIG. 3). Then, the next relation expressed by the mathematical expressions (4) to (6) is obtained. This relation is similar to the relation expressed by the mathematical expressions (1) to (3) in the first embodiment of the present invention.

$$Wa = \sum_{0}^{n} an \quad (4)$$

$$Wb = \sum_{0}^{n} bn \quad (5)$$

$$Wa < Wb \quad (6)$$

The flexible wiring board 1B in the present embodiment differs from the flexible wiring board 1A in the first embodiment of the present invention in that in the area X, each copper wire 5 angles towards the center in a width direction of the flexible wiring board 1B.

Some of the advantageous aspects of the present embodiment, maybe more specifically expressed, in formulaic terms as follows. On the bending line in the bending part 10, the distance between the copper wire 5a located at the outermost side in the width direction of the flexible wiring board 1B and the end portion in the same direction of the base film 2 and the cover film 7 may be represented by G0. Similarly, the distance between the copper wire 5b located at the opposite side to the copper wire 5a and at the outermost side and the end portion in the same direction of the base film 2 and the cover film 7 may be represented by Gn+1. On the other hand, the corresponding distances in the other area where the width of the flexible wiring board 1B is the same as the width in the area X may be respectively represented by Gb0 and Gbn+1. Here, the other area includes an area adjacent to the area X. In this case, in the present embodiment, the relation expressed by G0>Gb0 and Gn+1>Gbn+1 is obtained.

Satisfaction of the above relation implies that in the area X (at least on the bending line of the bending part 10), the distance between the copper wire 5a or 5b and the end portion in the width direction of the base film 2 and the cover film 7 is further increased as compared with that in the first embodiment of the present invention. In other words, in an area where the width of the flexible wiring board is the same, the width Wo of the area where the copper wire 5 is present on the bending line is made narrower than the width Wp of the area where the copper wire is present in the other position. Accordingly, even if the peeling occurs between the copper wire 5 and the cover film 7, the possibility of the peeling spreading to the end portion in the width direction of the base film 2 and the cover film 7 is further reduced.

Further, in the flexible wiring board 1B in the present embodiment, when a space between the adjacent copper wires 5 in the bending part 10 is represented by Gn (n equals 1 to n), the relation expressed by G0>Gn (n equals 1 to n) and Gn+1>Gn (n equals 1 to n) is obtained.

Satisfaction in the above relation implies that the distance (G0, Gn+1) between the end portion in the width direction of the base film 2 and the cover film 7 and the copper wire 5a or 5b is larger than the space between the adjacent copper wires 5 in the same area. Therefore, the peeling which occurs between the copper wire 5 and the cover film 7 can further securely be prevented from sequentially spreading to the end portion in the width direction of the base film 2 and the cover film 7.

In the flexible wiring board 1B shown in FIG. 3, it is noted that the copper wire 5 located closer to the end portion in the width direction of the flexible wiring board 1B is more inwardly angled and nested within the adjacent or inboard wire 5 within the bending part 10 as compared to the most inward wires 5. If the copper wires 5 are arranged in such a configuration, while avoiding unnecessarily increasing a space between the copper wires, sufficient copper wires 5 can easily be arranged to meet desired design specifications. Further, in the flexible wiring board 1B according to the present embodiment, if the relation expressed by Go>Gb0 and Gn+1>Gbn+1 is satisfied, the degree of inward angling and nesting is not necessarily limited. Also, for similar reasons, it is not necessary that all of the copper wires 5 be angled inward and/or nested.

Furthermore, in the flexible wiring board 1B shown in FIG. 3, the width of all of the copper wires 5 may be narrower in the area X than the width of the copper wires 5 in an area other than the area X. For example, the width of the copper wire 5 is given by a0<b0. However, in the flexible wiring board 1B according to the present embodiment, it is sufficient that the above-described relation expressed by the mathematical expressions (4) to (6) is satisfied, and it is not essential that the width of all of the copper wires 5 is made narrower. Hence, in an alternative embodiment, it is only required to narrow the width of one copper wire. In addition, it is not necessary that the width of each copper wire 5 including the width in the area x be uniform. Further, the area X satisfying the above-described mathematical expressions (4) to (6) can be provided at two or more places along a longitudinal direction of the flexible wiring board 1B.

Third Exemplary Embodiment

Figure 4:
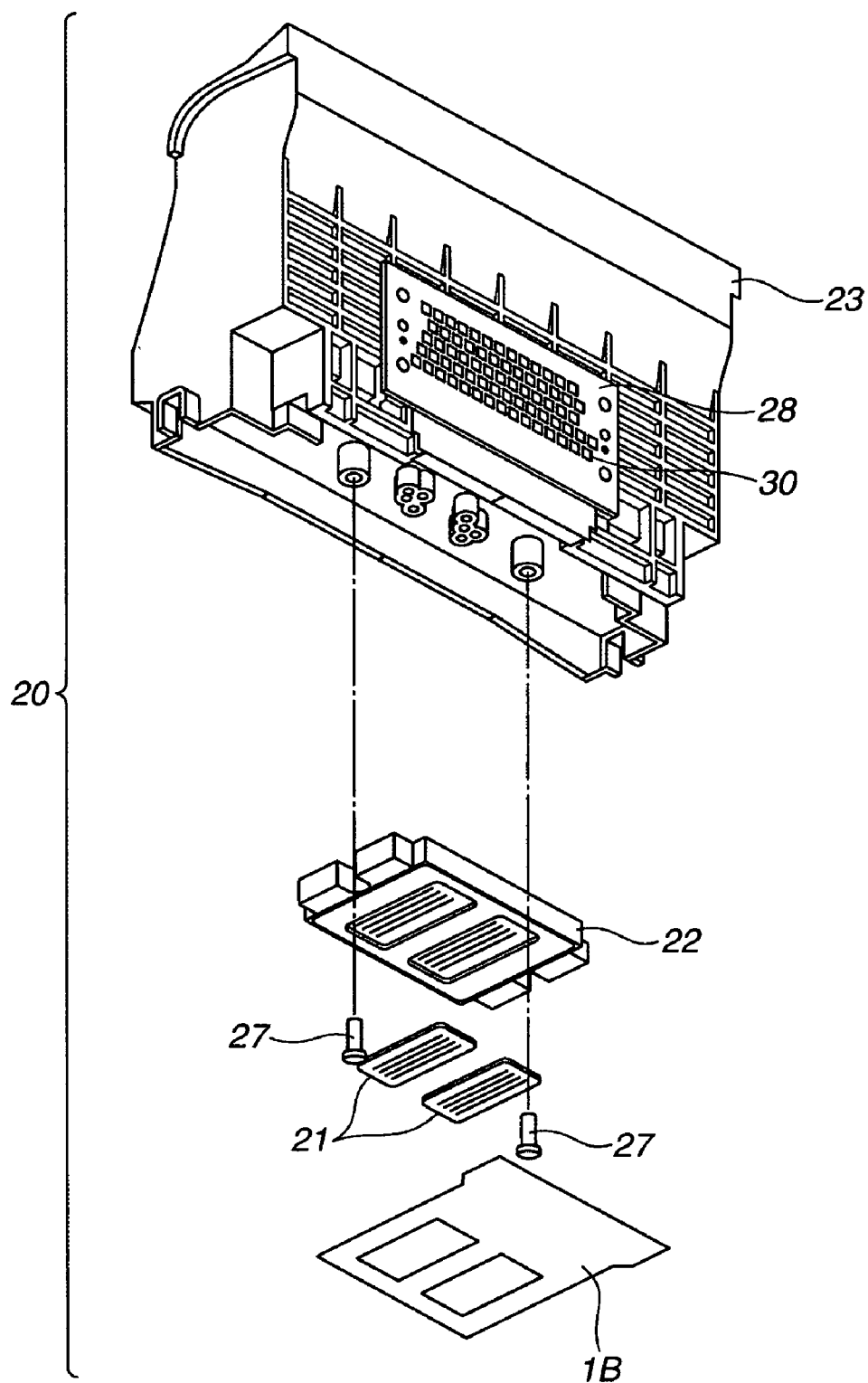
FIG. 4 is an exploded perspective view showing a liquid discharge recording head unit according to an embodiment of the present invention.
Figure 5:
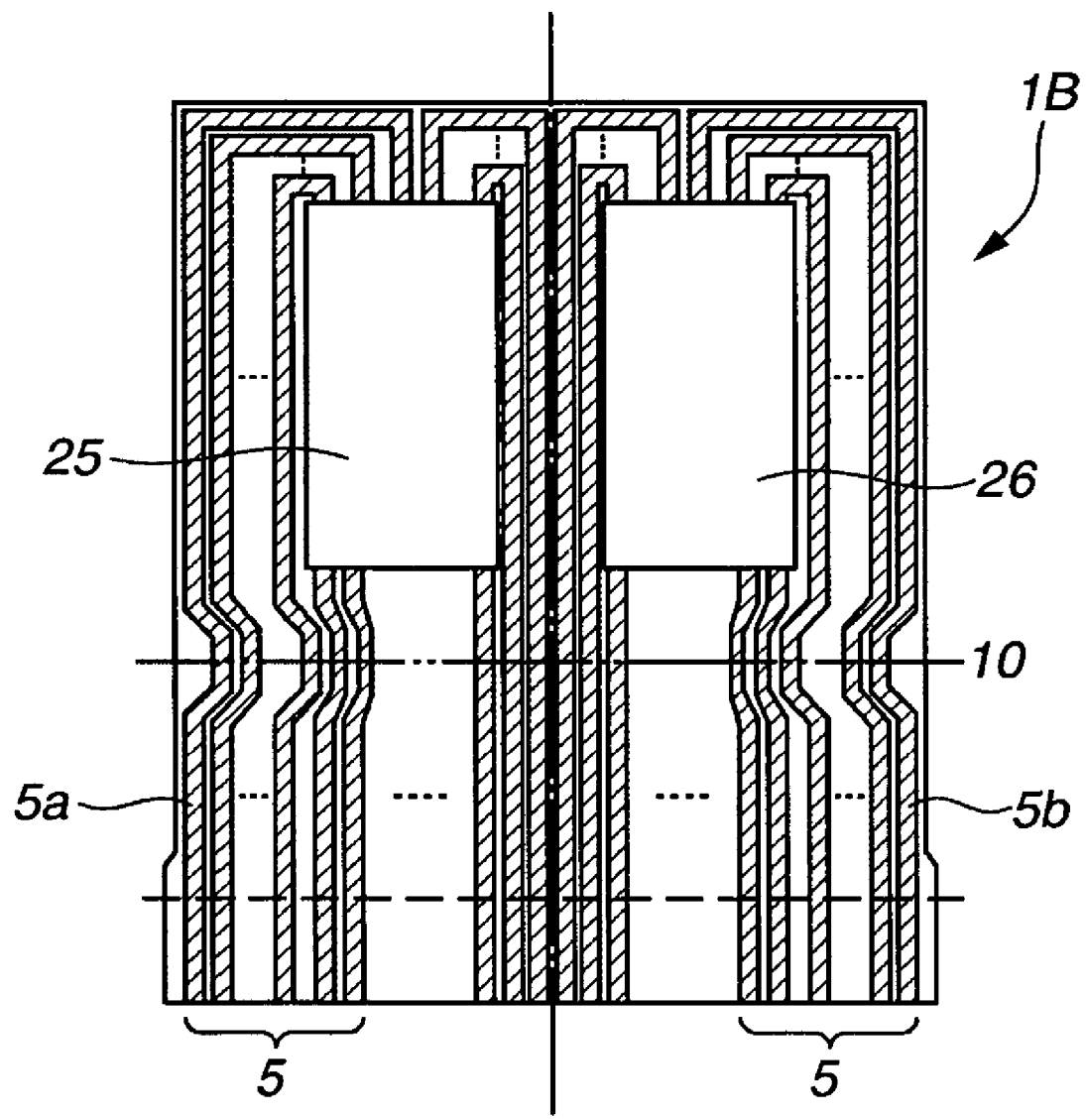
FIG. 5 is a plan view of a flexible wiring board shown in FIG. 4.

A liquid discharge recording head unit (hereinafter referred to as the "head unit") according to a third embodiment of the present invention will now be described with reference to FIGS. 4 and 5. FIG. 4 is an exploded perspective view showing a structure of the head unit 20 according to the present embodiment; while, FIG. 5 is a plan view showing the flexible wiring board 1B used for the head unit 20 in the present embodiment.

The head unit 20 according to the present embodiment is composed of, in addition to the flexible wiring board 1B, recording element substrates 21, a supporting substrate 22, a filter (not shown), a tank holder 23, etc. The recording element substrate 21 is typically a substrate made of silicon. On the surface of the recording element substrate 21, recording elements (heaters) for generating energy to discharge ink, and electric wires for transmitting electrical signals to the recording elements are formed. Further, on the front surface side of the recording element substrate 21, a plurality of ink flow paths and a plurality of discharge ports corresponding to the recording elements are formed by a photolithography technique. Furthermore, on the recording element substrate 21, an ink supply port in communication with the plurality of ink flow paths is formed. The ink supply port is open at the back surface of the recording element substrate 21. The recording element substrate 21 is bonded and fixed to a predetermined face (mounting face) of the supporting substrate 22 in such a manner that the ink supply port is in communication with a liquid chamber (not shown) provided on the supporting substrate 22.

The flexible wiring board 1B shown in FIG. 4 is equivalent to the flexible wiring board 1B shown in FIGS. 2 and 3. However, as shown in FIG. 5, the flexible wiring board 1B shown in FIG. 4 differs from that of FIGS. 2 and 3 in that rectangular openings 25 and 26, which are omitted in FIG. 3, are provided on one end in a longitudinal direction of the flexible wiring board 1B. One end of the flexible wiring board 1B provided with the openings 25 and 26 is bonded and fixed to the mounting face of the supporting substrate 22 on which the recording element substrates 21 are fixed, in such a manner that the two recording element substrates 21 are respectively fitted into the openings 25 and 26. Further, the copper wires 5 of the flexible wiring board 1B are connected to predetermined electric wires on the recording element substrate 21.

The supporting substrate 22 on which the recording element substrates 21 and the flexible wiring board 1B are fixed is fastened to the bottom surface of the tank holder 23 with screws 27. The other end of the flexible wiring board 1B is connected to a contact wiring board 28 mounted on the back surface of the tank holder 23. The contact wiring board 28 is provided with an external signal input terminal 30 for receiving an electrical signal outputted from a recording apparatus on which the head unit 20 is mounted. The electric signal inputted to the external signal input terminal 30 is transmitted to the recording element substrates 21 via the flexible wiring board 1B, and based on this electrical signal, a liquid such as ink or the like is discharged from the recording element substrates 21.

As shown in FIG. 4, the bottom surface of the tank holder 23 on which the supporting substrate 22 is fixed is approximately orthogonal to the back surface of the tank holder 23 on which the contact wiring board 28 is fixed. Hence, the flexible wiring board 1B, one end of which is fixed to the supporting substrate 22 and another end of which is fixed to the contact wiring board 28, is bent at the bending part 10 approximately at a right angle. However, as already described above, in the flexible wiring board 1B according to the present embodiment, even if the bending part 10 is bent at a right angle or at a small bend radius close to a right angle, peeling of a film, entry of ink from a space between peeled films, or the like, is substantially inhibited.

In the present embodiment, if an assembled head unit 20 is mounted on a recording apparatus, which will be described later, the bending part 10 is located in the vicinity of a conveyance mechanism for conveying a recording sheet and a cap mechanism for covering the discharge ports of the recording element substrates 21. The conveyance mechanism is required to pinch and convey a recording sheet with a pair of rollers, such as a conveyance roller, in a position as close to the discharge ports as possible so as to achieve more accurate conveyance. Hence, it is preferable that a discharge port placement face of the head unit 20 on which the discharge ports are placed and which faces the recording sheet is made as small as possible.

On the other hand, in order to securely cover the discharge ports with the cap mechanism, it can be that the discharge port placement face, with which a cap comes into contact, is planar. Further, the cap mechanism is configured to cover all of the discharge ports, including a plurality of discharge port arrays, with one cap. This is accomplished by securing a sufficient space so that the cap, which is located in the vicinity of the recording element substrates 21, comes into close contact with the recording element substrates 21. However, if this space is made wide, the conveyance mechanism such as a conveyance roller or the like is away from the recording element substrates 21, thereby causing a decrease in conveyance accuracy of the recording sheet. Therefore, it is desirable to reduce the gap around the head unit 20 mounted on the recording apparatus to be as small as possible so as to solve the problem. Further, a decrease in gap around the head unit 20 contributes to miniaturization of an entire recording apparatus.

It is effective from the viewpoint of reducing a gap around the head unit 20 when the head unit 20 is mounted on the recording apparatus that the bending part 10 of the flexible wiring board 1B is bent at a bend radius as small as possible and is disposed along the external surface of the head unit 20. Further, if the flexible wiring board 1B is disposed on the external surface of the tank holder 23 of the head unit 20 with close contact and without looseness, the gap around the head unit 20 can be made smaller.

An Exemplary Recording Apparatus

Figure 6:
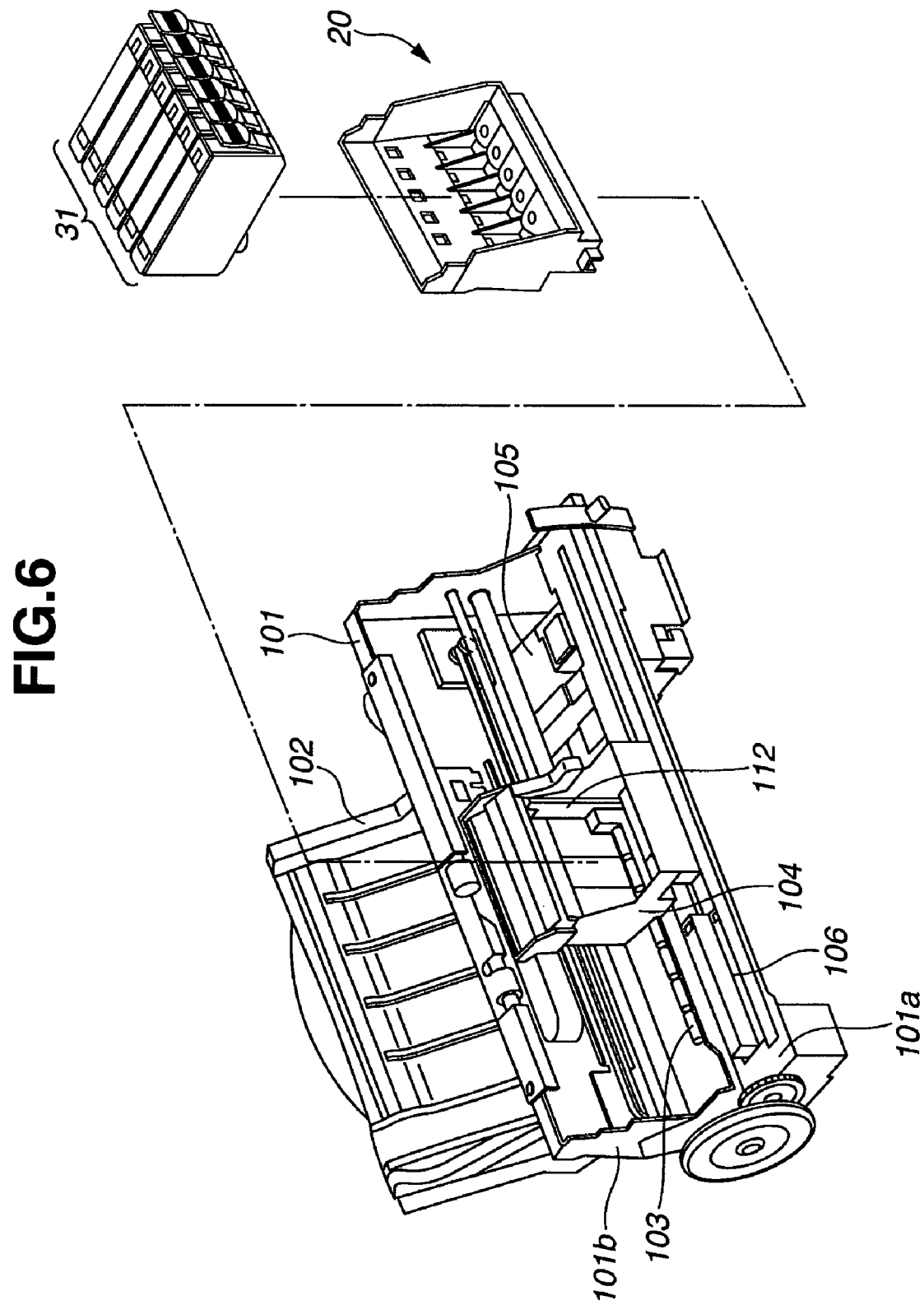
FIG. 6 is a perspective view showing a part of a recording apparatus on which the liquid discharge recording head unit shown in FIG. 4 is mounted.

An exemplary configuration of the recording apparatus on which the head unit 20 in the present embodiment is mounted will now be described next with reference to FIGS. 6 and 7. FIG. 6 is a perspective view showing an exemplary structure of the recording apparatus; while FIG. 7 is a side elevation perspective view of the apparatus from FIG. 6.

A chassis 101 is composed of a lower case 101a and an upper case 101b to accommodate various mechanisms (which will be described later) in the interior of the chassis 101.

An automatic feeder section 102 is adapted to automatically feed a recording sheet into the apparatus main body. A conveyance section 103 is adapted to lead a recording sheet which is sent out by one sheet at a time by the automatic feeder section 102 to a desired recording position, and further, to lead the recording sheet to a discharge section 106. A recording section 104 is adapted to perform a desired recording on the conveyed recording sheet. A recovery section 105 is adapted to perform recovery treatment on the recording section 104 or the like.

Figure 7:
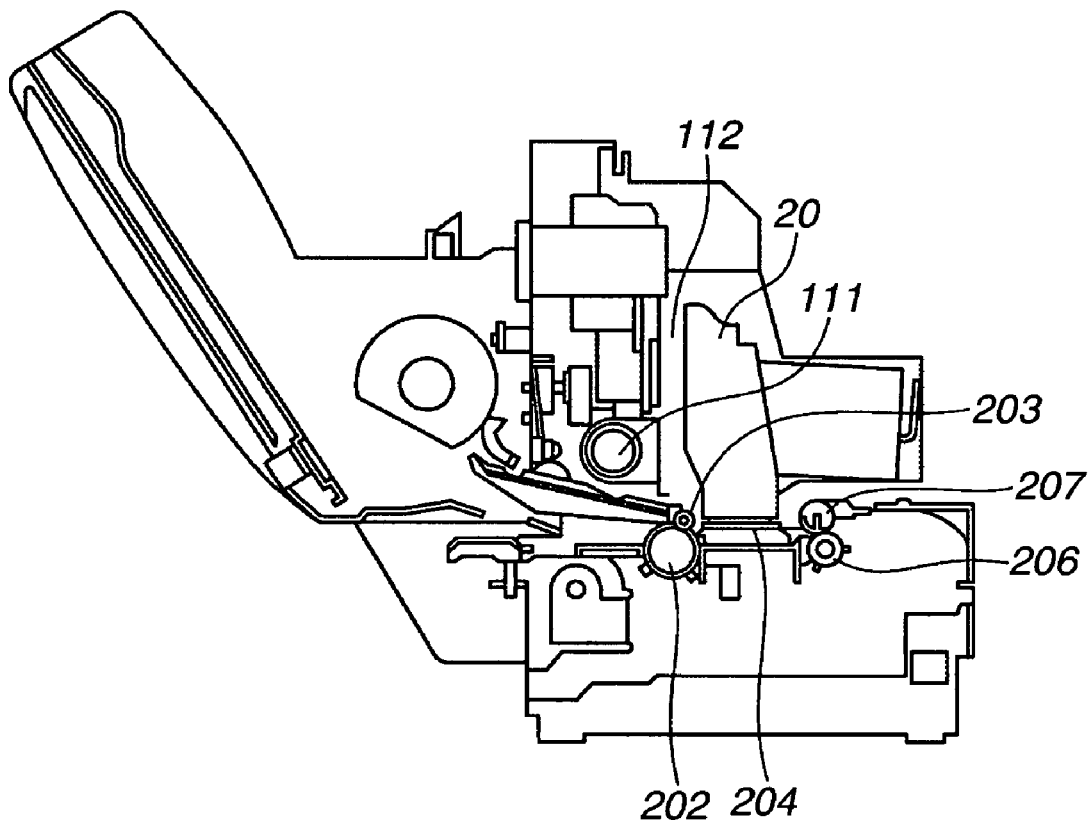
FIG. 7 is a side elevation perspective view of the recording apparatus on which the liquid discharge recording head unit shown in FIG. 4 is mounted.
Figure 8:
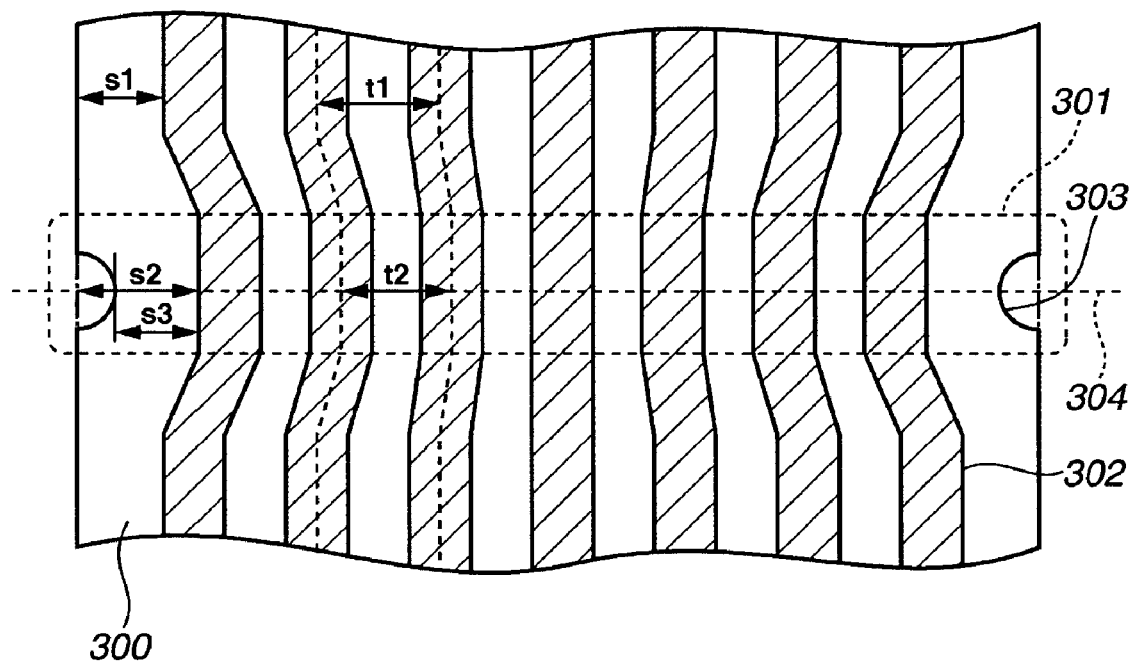
FIG. 8 is a partial plan view showing a conventional structure (prior art) of a flexible wiring board.

As shown in FIG. 7, the conveyance section 103 is provided with an LF roller 202, a pinch roller 203 and a platen 204. The LF roller 202 is fixed on a drive shaft supported to be rotatable, and is rotated by the driving force of an LF motor (not shown). Further, the pinch roller 203 is brought into pressure contact with the LF roller 202 and is rotated following the rotation of the LF roller 202.

The discharge section 106 is provided with a discharge roller 206 and a rotor 207. The rotor 207 is pressed against the discharge roller 206 and is rotated following the rotation of the discharge roller 206.

The head unit 20 is mounted on a carriage 112. The carriage 112 is adapted to perform a reciprocating movement along a carriage shaft 111 in directions (scanning directions) orthogonal to a conveyance direction of the recording sheet. Thus, the head unit 20 moves in conjunction with the carriage 112, discharges ink to the recording sheet waiting in a position where recording starts, and records an ink image based on predetermined image information.

As shown in FIG. 6, a plurality of ink tanks 31 can be attached to and detached from the tank holder 23. Ink in the ink tanks 31 attached to the tank holder 23 is supplied to the liquid chamber of the supporting substrate 22 through a flow path provided in the tank holder 23.

The above-described recording apparatus is of a cartridge type in which the head unit 20 is detachably mounted on the carriage 112. However, the head unit of the present invention can also be applied to a recording apparatus of a head-tank integral cartridge type in which a head unit integrated with an ink tank is detachably mounted on a carriage. Further, the head unit of the present invention can also be applied to a recording apparatus of a type in which a head unit is integrated with a carriage and only an ink tank is detachably mounted.

While the present invention has been described with reference to exemplary embodiments, it is to be understood that the invention is not limited to the disclosed exemplary embodiments. The scope of the following claims is to be accorded the broadest interpretation so as to encompass all modifications, equivalent structures and functions.

This application claims priority from Japanese Patent Application No. 2004-299213 filed Oct. 13, 2004, which is hereby incorporated by reference herein in its entirety.

What is claimed is:

1. A liquid discharge head, comprising:
a recording element substrate for discharging liquid responsive to an electrical signal from outside, the recording element substrate being disposed on a surface of the liquid discharge head;
a plurality of terminals for electrically connecting with outside, and disposed on a surface of the liquid discharge head other than the surface on which the recording element substrate is disposed; and
a flexible wiring board for electrically coupling the recording element substrate with the plurality of terminals, the flexible wiring board being disposed on the surface on which the recording element substrate is disposed and on the surface on which the plurality of terminals are disposed and comprising:
a base film substrate; and
a plurality of wires being disposed on the base film substrate and arranged along a width direction of the base film and covered with a film material bonded to the base film substrate;
wherein the flexible wiring board includes a flexing part to be bent along the width direction, and each wire to be formed in the flexing part, curves toward an inside of the base film substrate, and
wherein, in the flexing part, a curvature of the wire, to be formed in an end portion in the width direction, is larger than a curvature of the wire to be formed in the center in the width direction.

2. The liquid discharge head according to claim 1, wherein the flexible wiring board is bended along a corner formed by the surface on which the recording element substrate is disposed and the surface on which the terminals are disposed.

3. The liquid discharge head according to claim 1, wherein the flexible wiring board is bended substantially orthogonally along the corner.

4. A liquid discharge head comprising:
a recording element substrate for discharging liquid responsive to an electrical signal from outside, the recording element substrate being disposed on a surface of the liquid discharge head;
a contact wiring board having a plurality of terminals for electrically connecting with outside, and disposed on a surface of the liquid discharge head, the surface being substantially perpendicular to a surface on which the recording element substrate is disposed; and
a flexible wiring board for electrically coupling the recording element substrate with the plurality of terminals, the flexible wiring board being disposed along the surface on which the recording element substrate is disposed and along the surface on which the contact wiring substrate is disposed, the flexible wiring board comprising, a base film substrate; and a plurality of wires being disposed on the base film substrate and arranged along a width direction of the base film and covered with a film material bonded to the base film substrate, wherein the flexible wiring board includes a flexing part to be bent along the width direction, and each wire to be formed in the flexing part, curves toward an inside of the base film substrate, and wherein, in the flexing part, a curvature of the wire, to be formed in an end portion in the width direction, is larger than a curvature of the wire to be formed in the center in the width direction.

* * * * *